United States Patent
Pindl et al.

(10) Patent No.: US 10,804,439 B2
(45) Date of Patent: Oct. 13, 2020

(54) METHOD OF PRODUCING A PLURALITY OF CONVERSION ELEMENTS AND OPTOELECTRONIC COMPONENT

(71) Applicant: OSRAM OLED GmbH, Regensburg (DE)

(72) Inventors: Markus Pindl, Tegernheim (DE); Martin Brandl, Kelheim (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/037,388

(22) Filed: Jul. 17, 2018

(65) Prior Publication Data

US 2019/0027655 A1  Jan. 24, 2019

(30) Foreign Application Priority Data

Jul. 19, 2017 (DE) .......... 10 2017 116 279

(51) Int. Cl.
*H01L 33/50* (2010.01)

(52) U.S. Cl.
CPC .......... *H01L 33/502* (2013.01); *H01L 33/504* (2013.01); *H01L 33/507* (2013.01); *H01L 2933/0041* (2013.01)

(58) Field of Classification Search
CPC . H01L 33/005–0091; H01L 33/50–508; H01L 2233/0041
See application file for complete search history.

(56) References Cited

U.S. PATENT DOCUMENTS

| 7,847,302 B2 | 12/2010 | Basin et al. |
| 8,513,872 B2 | 8/2013 | Annen et al. |
| 9,466,771 B2 * | 10/2016 | Anc .......... C09K 11/025 |

(Continued)

FOREIGN PATENT DOCUMENTS

| CN | 102376860 A | 3/2012 |
| CN | 104103745 A | 10/2014 |

(Continued)

OTHER PUBLICATIONS

Notification of Reasons for Refusal dated Jun. 17, 2019, of counterpart Japanese Application No. 2018-135062, along with an English translation.

(Continued)

*Primary Examiner* — Daniel Luke
(74) *Attorney, Agent, or Firm* — DLA Piper LLP (US)

(57) ABSTRACT

A method produces a plurality of conversion elements including: A) providing a first carrier; B) applying a first element to the first carrier using a first application technique, the first element including a conversion material, the first application technique being different from compression molding; C) applying a second element to the first carrier by a second application technique, the second element including quantum dots, the quantum dots being introduced into a matrix material and being different from the conversion material, the second application technique being molding or compression molding; D) hardening of the matrix material; E) optionally, rearranging the arrangement produced according to step D) to a second carrier; and F) separating so that a plurality of conversion elements are generated.

17 Claims, 4 Drawing Sheets

(56) References Cited

U.S. PATENT DOCUMENTS

| 9,660,151 | B2 | | 5/2017 | Tamaki |
| 9,709,225 | B2 | | 7/2017 | Stoll et al. |
| 9,768,364 | B2 | * | 9/2017 | Tamaki ................. H01L 33/505 |
| 10,109,779 | B2 | | 10/2018 | Okahisa |
| 10,230,027 | B2 | * | 3/2019 | Chen ....................... H01L 33/60 |
| 2013/0140591 | A1 | | 6/2013 | Tseng et al. |
| 2019/0027663 | A1 | | 1/2019 | Okahisa |

FOREIGN PATENT DOCUMENTS

| CN | 106129229 A | 11/2016 |
| DE | 10 2013 207 226 A1 | 10/2014 |
| DE | 10 2015 119 817 A1 | 5/2017 |
| EP | 2 549 330 A1 | 1/2013 |
| JP | 2007-067420 A | 3/2007 |
| JP | 2015-046534 A | 3/2015 |
| JP | 2015-532501 A | 11/2015 |
| JP | 2016-001735 A | 1/2016 |

OTHER PUBLICATIONS

The First Office Action dated Aug. 3, 2020, of counterpart Chinese Application No. 201810789482.1, along with an English translation.

\* cited by examiner

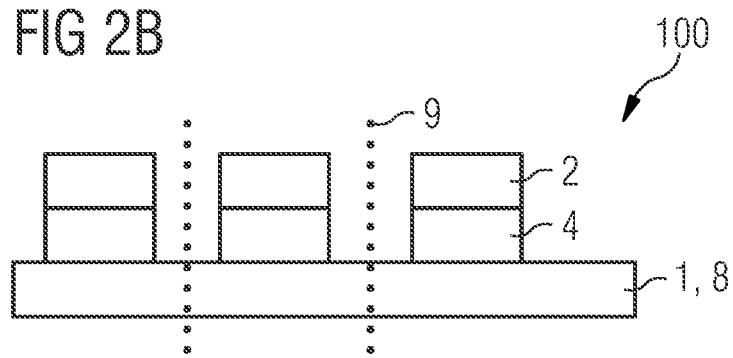

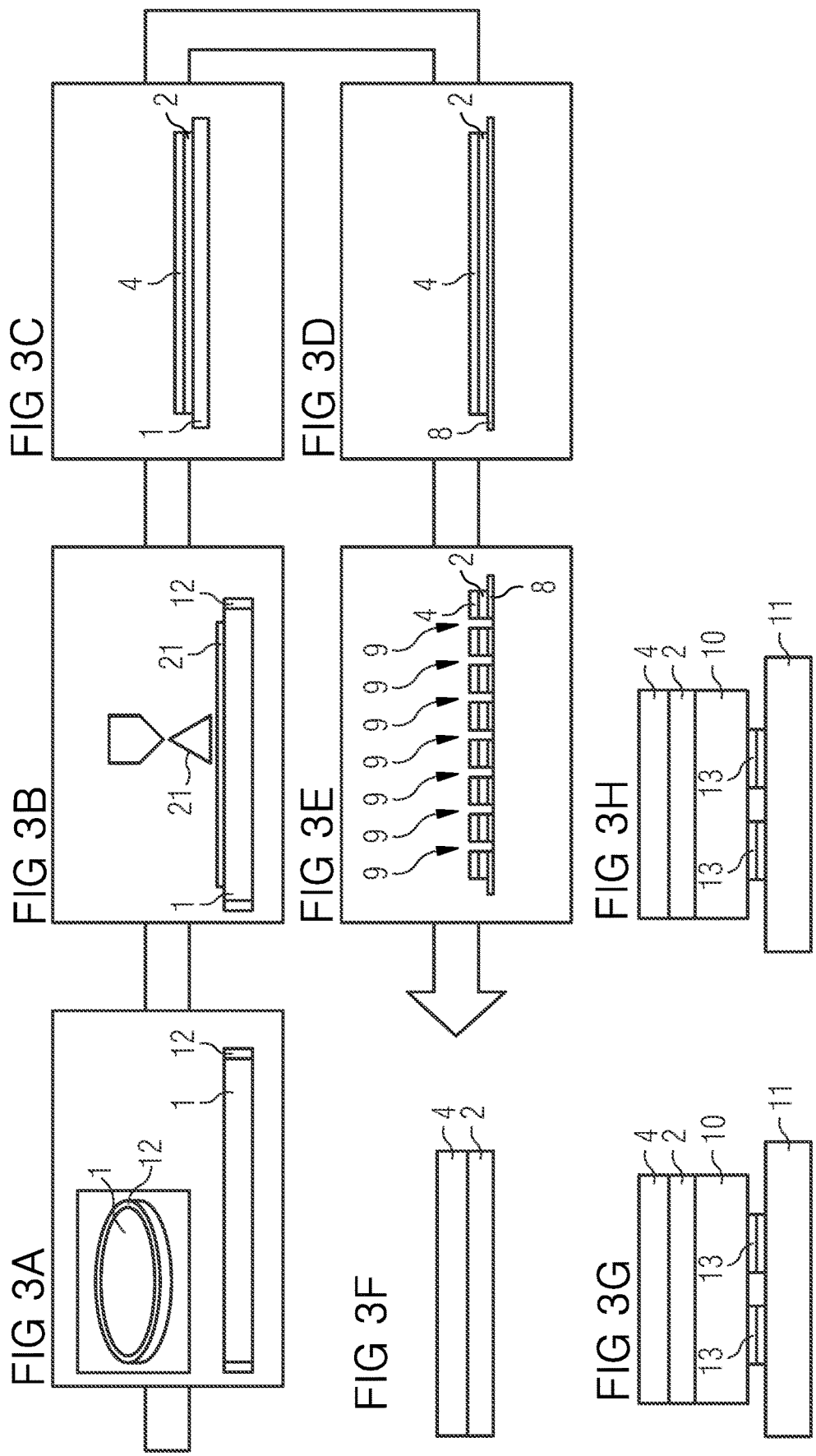

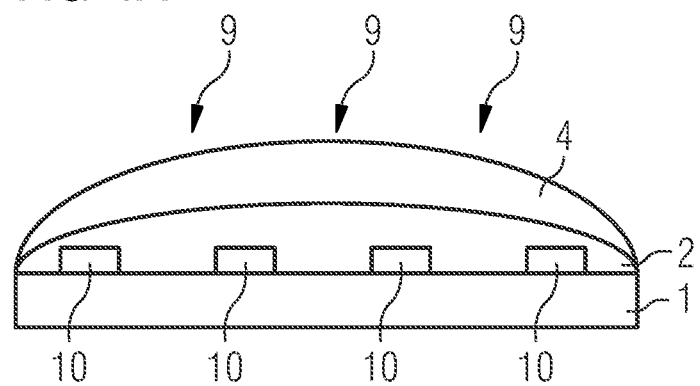
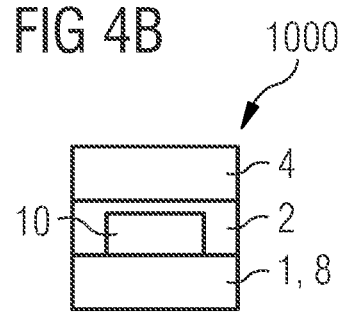

METHOD OF PRODUCING A PLURALITY OF CONVERSION ELEMENTS AND OPTOELECTRONIC COMPONENT

TECHNICAL FIELD

This disclosure concerns a method of producing a plurality of conversion elements and an optoelectronic component comprising at least one conversion element produced by the method.

BACKGROUND

Conversion elements often comprise conversion materials such as conventional conversion materials or quantum dots. The conversion materials convert the radiation emitted by a radiation source into radiation with a different, for example, longer wavelength. The conversion materials are usually dispersed in a matrix material to obtain the conversion material in a processable form. Quantum dots as conversion materials have the disadvantage that they usually consist of cadmium selenide or comprise cadmium selenide and are therefore critical according to EHS (Environment Health and Safety). Due to this problem, application techniques such as spray coating cannot be recommended as a method, as the entire process chamber would be contaminated with the toxic material. This results in a high material throw-off and a complex cleaning method of the system.

It could therefore be helpful to provide a plurality of conversion elements or at least one conversion element that can be easily produced. In particular, it could be helpful to provide a method having a combination of techniques for the application of elements that can be used to produce conversion elements comprising quantum dots that are significantly more harmless from an EHS perspective.

There are currently no known quantum-dot-comprising conversion elements for a so-called "layer attach" on semiconductor chips. Conversion layers are produced by screen printing or spray coating methods as standard. However, both methods are problematic for the handling of quantum dots, some of which are toxic, as relatively large quantities of toxic waste material are produced on the one hand and complex cleaning of the systems is required on the other.

SUMMARY

We provide a method of producing a plurality of conversion elements including:
A) providing a first carrier,
B) applying a first element to the first carrier using a first application technique, the first element including a conversion material, the first application technique being different from compression molding,
C) applying a second element to the first carrier by a second application technique, the second element including quantum dots, the quantum dots being introduced into a matrix material and being different from the conversion material, the second application technique being molding or compression molding,
D) hardening of the matrix material,
E) optionally, rearranging the arrangement produced according to step D) to a second carrier, and
F) separating so that a plurality of conversion elements are generated.

BRIEF DESCRIPTION OF THE DRAWINGS

FIGS. 2A and 2B show method steps according to an example.

FIGS. 3A to 3H show a method of producing conversion elements according to an example.

FIGS. 4A and 4B show method steps according to an example.

Figure 1A:
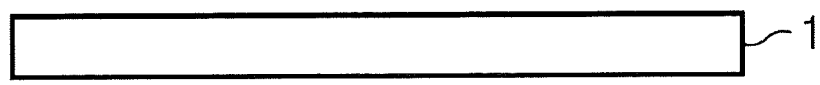
FIGS. 1A to 1D show a method of producing a plurality of conversion elements.

REFERENCE SIGN LIST 1000 optoelectronic component
100 conversion element
1 first carrier
2 first element
21 conversion material
22 further matrix material
3 first application technique
4 second element
5 compression molding
6 quantum dots
7 matrix material
8 second carrier
9 separation
10 semiconductor chip or semiconductor chips
11 circuit board
12 grip rings
13 electrical contact structures

DETAILED DESCRIPTION

Our method produces a plurality of conversion elements comprising:
A) providing a first carrier,
B) applying a first element to the first carrier using a first application technique, the first element comprising a conversion material,
C) applying a second element to the first carrier by compression molding, the second element having quantum dots, the quantum dots being introduced into a matrix material and being different from the conversion material, the first application technique being different from compression molding,
D) hardening of the matrix material,
E) optionally, rearranging the arrangement generated according to step D) to a second carrier, and
F) separating so that a plurality of conversion elements are produced.

The method may have a step A), providing a first carrier. The first carrier can be a film, a foil, a sheet, a laminate or a wafer. For example, the first carrier can be made of sapphire or comprise sapphire. Preferably, the first carrier is formed from or comprises polytetrafluoroethylene and is designed as a film. The film can be surrounded by a so-called "grip" ring.

The method is preferably carried out in the sequence of method steps A) to F). Alternatively, the method steps, in particular method steps B) and C), can be interchanged.

The method may comprise a step B), applying a first element to the first carrier by a first application technique. The first element has a conversion material. In particular, the conversion material is embedded in a further matrix material.

The first application technique may be a spray coating. Spray coating is well known and therefore not explained in detail.

Alternatively, the first application technique can be electrophoretic deposition. Electrophoretic deposition is sufficiently known and therefore not explained.

The first element may comprise a conversion material. The conversion material is designed, for example, to convert the radiation emitted by a semiconductor chip into radiation with a different wavelength. In particular, any conventional conversion material or conventional phosphors can be used as conversion material. For example, the following conversion materials can be used: Europium-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$, garnets such as $(Gd,Lu,Tb,Y)_3(Al,Ga,D)_5(O,X)_{12}:RE$ with X=halogen, N or divalent elements, D=tri- or tetravalent elements and RE=rare earth metals such as $Lu_3(Al_{1-x}Ga_x)_5O_{12}:Ce^{3+}$, $Y_3(Al_{1-x}Ga_x)_5O_{12}:Ce^{3+}$, europium-doped sulfides such as $(Ca,Sr,Ba)S:Eu^{2+}$; SiAlONs such as $Li_xM_yLn_zSi_{12-(m+n)}Al_{(m+n)}OnN_{16-n}$; beta-SiAlONs such as $Si_{6-x}Al_xO_yN_{8-y}:RE_z$; nitride orthosilicates such as $AE_{2-x-a}RE_xEu_aSiO_{4-x}N_x$, $AE_{2-x-a}RE_xEuaSi_{1-y}O_{4-x-2y}N_x$ with RE=rare earth metals and AE=alkaline earth metal, chlorosilicates such as $Ca_8Mg(SiO_4)_4C_{12}:Eu^{2+}$, chlorophosphates such as $(Sr,Ba,Ca,Mg)_{10}(PO_4)_6Cl_2:Eu^{2+}$, BAM luminescent materials from the barium oxide, magnesium oxide and aluminium oxide system such as $BaMgAl_{10}O_{17}:Eu^{2+}$, halogen phosphates such as $M_5(PO_4)_3(Cl,F):(Eu^{2+}, Sb^{3+}, Mn^{2+})$, SCAP luminescent materials such as $(Sr,Ba,Ca)_5(PO_4)_3Cl:Eu^{2+}$. Conversion materials as described in EP 2549330 A1 can also be used.

Quantum dots can also be used as conversion materials. The quantum dots may take the form of nanocrystalline materials comprising materials from the group of II-VI compounds and/or from the group of III-V compounds and/or from the group of IV-VI compounds and/or metal nanocrystals. Preferably, the quantum dots comprised in the conversion material are non-toxic.

The method may comprise a step C), applying a second element to the first carrier by compression molding, the second element comprising quantum dots, the quantum dots being introduced into a matrix material. The first application technique differs from compression molding.

Molding (e.g. Compression Molding) is sufficiently known and therefore not explained in detail.

The quantum dots may be toxic. In particular, the quantum dots are critical according to EHS.

The quantum dots may be selected from a group comprising InP, CdS, CdSe, InGaAs, GaInP and $CuInSe_2$. The quantum dots are designed for wavelength conversion of radiation. The quantum dots each have a surface. Wavelength-converting quantum dots are particularly sensitive conversion materials, i.e. materials sensitive to oxygen, moisture and/or acid gases. Preferably, the quantum dots are nanoparticles, i.e. particles with a size in the nanometer range with a particle diameter d50 of, for example, at least 1 nm to at most 1000 nm.

The quantum dots comprise a semiconductor core with wavelength-converting properties. In particular, the core of the quantum dots comprises or consists of a II-IV or III-V semiconductor. For example, the semiconductor core is selected from a group that includes InP, CdS, CdSe, InGaAs, GaInP and $CuInSe_2$. The semiconductor core can be coated with one or more layers, i.e. cladding layers. The coating can be organic and/or inorganic. In other words, the outer surface or surface of the semiconductor core may be completely or almost completely covered by additional layers.

The semiconductor core can be a single-crystal or polycrystalline agglomerate.

The quantum dots may have an average diameter of 3 nm to 10 nm, especially preferably 3 nm to 5 nm. By varying the size of the quantum dots, the wavelength of the converting radiation can be varied and thus adapted accordingly for the respective application. The quantum dots can be spherical or rod-shaped.

For example, a first cladding layer of a quantum dot is formed with an inorganic material such as zinc sulfide, cadmium sulfide and/or cadmium selenide and generates the quantum dot potential. The first cladding layer and the semiconductor core can be almost completely enclosed by at least one second cladding layer on the exposed surface. In particular, the first cladding layer is an inorganic ligand shell with an average diameter including the semiconductor core of 1 to 10 nm. The second cladding layer can, for example, be formed with an organic material such as cystamine or cysteine, and sometimes improves the solubility of the quantum dots in, for example, the matrix material and/or a solvent. It is possible that due to the second cladding layer a spatial uniform distribution of the quantum dots in the matrix material is improved.

For example, the matrix material may consist of at least one of the following substances: Acrylic, silicone, hybrid material such as Ormocer, for example, Ormoclear, polydimethylsiloxane (PDMS), polydivinylsiloxane or mixtures thereof.

The quantum dots and the conversion material may each be formed as particles. Preferably, the size of the quantum dots is smaller than the size of the conversion material particles. In other words, the particles of the conversion materials are larger than the particles of the quantum dots. For example, the conversion materials have a particle diameter (d50) of 10 μm to 25 μm.

The conversion material may be introduced into a further matrix material, in particular dispersed. In particular, the first element is formed as a layer. The first element can have a layer thickness of 30 μm to 300 μm, especially preferably 60 μm to 150 μm. The materials described here for the matrix material can be used as materials for the further matrix material and vice versa. In particular, the matrix material and/or the further matrix material are formed or consist of silicone, polysiloxane, epoxy or a hybrid material.

The second element may be formed as a layer. Preferably, the second element has a layer thickness of 10 μm to 150 μm, especially preferably 30 μm to 80 μm.

The conversion material may be homogeneously distributed in the first element and/or the quantum dots in the second element. Alternatively, the quantum dots and/or the conversion materials are distributed in the corresponding elements with a concentration gradient.

Steps C) and/or D) may occur before step B). This produces the second element before the first element on the first carrier. Preferably, the first carrier is provided. Then the second element is applied to the first element. A layer sequence results from the first carrier, second element and first element. If necessary, a further layer, for example, an adhesive layer can be arranged between the first element and the first carrier.

The first element and the second element may be designed as a layer sequence. In particular, the sequence of layers can have the sequence of first carrier or second carrier, first element and second element. In particular, the elements and the first and/or second carrier are arranged in direct mechanical contact with each other. Alternatively, the layer sequence can also have the sequence of the first or second carrier, then the second element and then the first element. Here, too, the elements and the carrier can preferably be arranged in direct mechanical contact with each other.

The conversion element may be part of a solid state lighting arrangement. In other words, the conversion element is used for general lighting.

Alternatively, the conversion element is part of a backlighting arrangement.

Preferably, at least one conversion element is arranged or inserted in a beam path of a semiconductor chip. The beam path can also be formed from more than one semiconductor chip.

Preferably, the at least one semiconductor chip emits radiation from the IR, UV and/or visible wavelength range. For example, the semiconductor chip emits radiation from the blue wavelength range.

The semiconductor chip may be an inorganic light emitting diode. The semiconductor chip can have a semiconductor layer sequence. The semiconductor layer sequence can consist of or comprise a III-V semiconductor material. For example, the semiconductor material is a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, where $0 \leq n \leq 1$, $0 \leq m \leq 1$ and $n+m \leq 1$, respectively. The semiconductor layer sequence can contain dopants and additional components. For simplicity's sake, however, only the essential components of the crystal lattice of the semiconductor layer sequence, i.e. Al, As, Ga, In, N or P, are mentioned, even if these can be partially replaced and/or supplemented by small amounts of other substances.

The semiconductor layer sequence comprises one or more active layers. The at least one active layer is designed to generate electromagnetic radiation. For example, the active layer comprises at least one pn junction or at least one quantum well structure. In particular, ultraviolet, visible and/or near-infrared radiation is generated in the active layer during operation of the semiconductor device. The radiation generated in the active layer has a peak wavelength. The peak wavelength is the wavelength at which the highest radiation intensity is generated during normal operation.

A plurality of semiconductor chips may be inserted before step F). In this case, step E) does not take place. A wafer is preferably used as the first carrier. In other words, a wafer is provided as the first carrier, for example, a silicon wafer. A first element is then applied to the wafer and the plurality of semiconductor chips using a first application technique, for example, spray coating. The second element, which comprises the quantum dots, can then be applied by compression molding or molding. Alternatively, the second element and then the first element can be applied to the wafer and semiconductor chips. In a further step, the corresponding matrix materials can be cured. If necessary, the thus generated arrangement can be rearranged to a second carrier, in particular re-laminated. Afterwards a separation can take place so that a plurality of optoelectronic components is produced, each of which has the conversion element described here.

The first element may emit radiation from the green wavelength range and the second element may emit radiation from the red wavelength range. Alternatively or additionally, at least one semiconductor chip emits radiation from the blue wavelength range. The optoelectronic component can be set up for full or partial conversion. For example, white mixed light can be emitted from the optoelectronic component during partial conversion.

Alternatively, the first element can emit radiation from the red wavelength range and the second element can emit radiation from the green wavelength range. The semiconductor chip is then preferably designed to emit radiation from the blue wavelength range.

The method may comprise a step D), hardening of the matrix material produced or applied in step B).

The matrix material or the further matrix material can be cured after application. Curing can take place, for example, by raising the temperature or UV radiation. If necessary, initiators can also be added for curing.

The method can have a step E): rearranging the arrangement created after step D) to a second carrier. For example, rearranging can be done by re-laminating. The first carrier is, for example, a laminate or a film made of polytetrafluoroethylene. The second carrier can be, for example, a sawing foil. By re-laminating on the second carrier, adhesion of the generated arrangement can be ensured and separation can then take place.

The method may have a step F): separating so that a plurality of conversion elements are generated.

According to at least one aspect, the first carrier and the second carrier are the same. In other words, step E) does not take place here. This means that the first carrier remains part of the method at least until it is separated.

We also provide an optoelectronic component and a conversion element generated by the method. All aspects and definitions of the conversion element and the method of producing a plurality of conversion elements also apply to the conversion element and also to the optoelectronic component and vice versa.

The optoelectronic component may have at least one conversion element in the beam path. The conversion element is preferably produced using our method. Alternatively or additionally, the optoelectronic component can also have a plurality of conversion elements. In addition, the optoelectronic component can have a semiconductor chip or a plurality of semiconductor chips.

We recognized that a combination of a first application technique with compression molding, the first application technique being spray coating in particular, can provide a low-cost method that preferably easily applies toxic quantum dots to semiconductor chips. A combination of spray coating for the application of conventional conversion materials with preferably larger grain sizes and compression molding for the application of toxic quantum dots with smaller grain sizes is made possible in this method.

Alternatively, conventional fine-grained particles such as titanium dioxide or phosphors with a size of >5 μm can also be produced using compression molding methods. Compression molding is very well suited for this since the fine particles can be applied in thinner layers (approx. 30 μm thickness) without segregation (so-called flow lines). Larger grain sizes mean grain sizes with a diameter of >20 μm. Smaller grain sizes mean in particular grain sizes with a diameter of <20 μm.

A conventional conversion material (phosphor) may be applied to a temporary carrier by spray coating. The conversion material particles are preferably embedded in a further matrix material such as silicone or epoxy. A curing step can then be carried out to crosslink the further matrix material. Subsequently, a quantum-dot-comprising layer can be applied via compression molding. The quantum dots can also be embedded in a matrix material. The matrix material can then be cured to cross-link. Optionally, further layers with quantum dots or diffuser layers can be applied using molding presses. The arrangement can be laminated on a sawing foil. The produced multi-layer silicone film can then be separated into individual conversion plates.

The conversion elements can be applied to the surface or in particular to the radiation main surface of at least one semiconductor chip in the so-called pick-and-place method.

Further elements with quantum dots, for example, may be applied after step D). Further elements can be applied by compression molding. The other elements can comprise quantum dots embedded in a matrix material.

Further layers with diffuser properties can be applied after step C). These layers are also called diffuser layers.

Step B) may be omitted. In other words, no first element is applied to the first carrier. This can be the case, for example, if no coarse phosphors are required. The conversion element then does not have a first element, but comprises the second element. In other words, the conversion element does not comprise any conventional conversion materials, but only quantum dots, e.g. toxic quantum dots.

It is also possible that additional layers of clear silicone can be molded or sprayed on. This can increase the mechanical reinforcement.

The conversion element can be used for backlighting methods or backlighting. The method can be used, for example, to produce special conversion elements for backlighting. For this purpose, conventional red emitting conversion materials can be applied by spray coating. A very narrow-band emitting phosphor can be used. Subsequently, a second green-emitted element with quantum dots can be applied to the red emitting conversion material by compression molding. The conversion elements produced by this method, which are preferably formed as conversion plates, can then be produced. The conversion plates are distinguished by very narrow-band emissions (narrow-band red emitting conversion material and narrow-band green quantum dots). Since the blue emitting semiconductor chip also emits very narrow-band, a very large color space can be created, which enables a very high color saturation of LCD displays.

The conversion element may be used for solid state lighting (SSL). This refers to a type of lighting that uses light emitting diodes (LEDs), organic light emitting diodes (OLEDs) or polymer light emitting diodes (PLEDs) and laser diodes as light sources.

A conversion element can be produced from a broadband green-emitting conversion material applied by spray coating and a narrow-band red emitting second element comprising quantum dots applied by compression molding. This allows a high efficiency (ln/W) to be generated since narrow-band red emitting quantum dots do not emit in the infrared range in particular.

The second element, which comprises quantum dots, can be advantageous for the following reasons:

Due to the small grain size of the quantum dots, which lie in the nanometer range without encapsulation and are encapsulated by a few micrometers, very thin layers, for example, of 30 μm thickness can be produced by compression molding without segregation phenomena, so-called flow lines.

No waste material is produced during compression molding, i.e. no toxic material residues have to be disposed of.

During compression molding, the forming cavity is protected by an ETFE film. ETFE means here ethylene-tetrafluoroethylene copolymer. ETFE is a derivative of Teflon (PTFE) that can be used for compression molding protection films due to its good non-stick properties. The protective film can be located between the mold tool and the mold material introduced (e.g. silicone with fluorescent material) and can prevent the mold material from sticking to the mold tool. This prevents the tool from being contaminated with the toxic material comprising quantum dots. This eliminates time-consuming cleaning methods. The method can be carried out cost-effectively.

Further advantages and developments result from the examples described below in connection with the figures.

In the examples and figures, identical, similar or equivalent elements can each be provided with the same reference signs. The represented elements and their proportions among themselves are not to be regarded as true to scale. Rather, individual elements such as layers, components and areas can be displayed in exaggerated sizes for better displayability and/or better understanding.

Figure 1B:
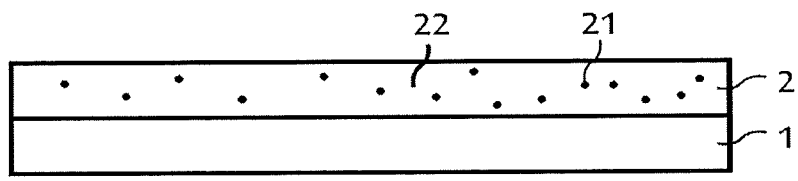
Figure 1C:
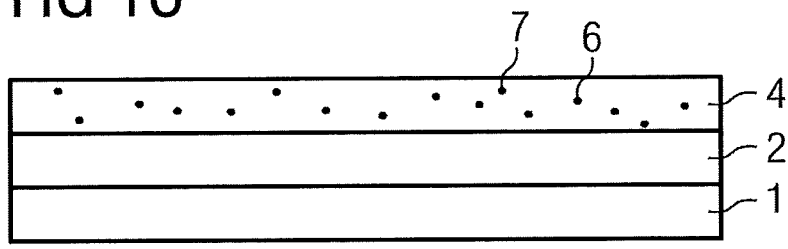
Figure 1D:
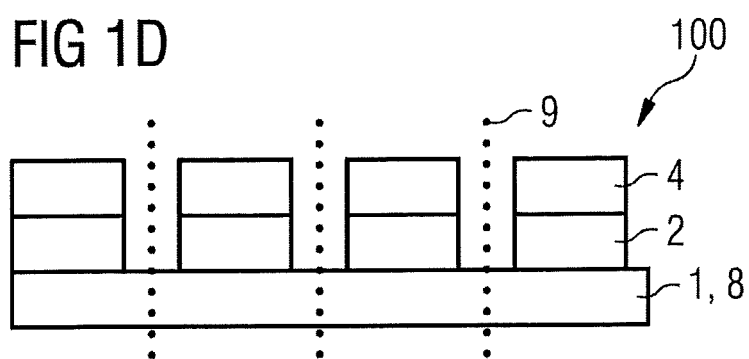

FIGS. 1A to 1D show a method of producing a plurality of conversion elements according to an example. As shown in FIG. 1A, a carrier such as a polytetrafluoroethylene film is provided. A first element 2 is applied to this first carrier 1. The first element 2 is applied using a first application technique 3. The first application technique 3 can be, for example, spray coating or electrophoretic deposition. The first element 2 may comprise a conversion material 21, in particular a conventional phosphor (FIG. 1B). Conversion material 21 may be dispersed in a further matrix material 22 (not shown). A second element 4 can be created on the first element 2 by compression molding (FIG. 1C). The second element 4 can comprise quantum dots 6. Quantum dots 6 are dispersed in a matrix material 7, for example, made of silicone. The matrix material 7 can then be cured. Before step C), a further matrix material can also be cured. The first element 2 and the second element 4 can each be formed as layers, for example, with a layer thickness of about 30 μm. Then the arrangement generated in step D) can be laminated onto a second carrier 8 (not shown). The arrangement can then be separated by separation 9 (FIG. 1D) so that a plurality of conversion elements is produced. For example, each conversion element has the first or second carrier 1, 8, the first element 2 and the second element 4.

As an alternative to the method in FIGS. 1A to 1D, the first element 2 and the second element 4 may also be interchanged. In other words, first the second element 4 is applied to the first carrier 1 and then the first element 2 is applied to the second element 4 (FIG. 2A).

According to FIG. 2B, the plurality of conversion elements generated after separation 9 then has a layer sequence of first or second carrier 1, 8, subsequently second element 4 and subsequently first element 2. Adhesive layers may be present between the first or second carrier 1, 8 and the second element 4. The adhesive layers may comprise silicone, for example.

FIGS. 3A to 3H show a method of producing a plurality of conversion elements.

According to FIG. 3A, a first carrier 1 is provided. The first carrier 1 is set up to be spray coated. For example, the first carrier 1 is a polytetrafluoroethylene film with grip rings 12.

In accordance with FIG. 3B, for example, the conversion material 21 can then be applied by spray coating. In particular, the conversion material has 21 particle sizes of >20 μm. A homogeneous layer can be created.

As shown in FIG. 3C, a compression molding method can then create the second element 4. The second element 4 comprises quantum dots 6, which in particular have a smaller particle diameter than the conventional conversion material 21, which is applied by spray coating.

According to FIG. 3D, the arrangement is then applied to a second carrier 8, in particular a sawing foil. Sawing foil 8 increases adhesion.

In accordance with FIG. 3E, a separation is then performed so that a plurality of conversion elements are generated.

At least one conversion element results, which has a layer sequence of a first element 2 and a second element 4.

For example, as shown in FIGS. 3G and 3H, this conversion element can be applied to a semiconductor chip 10. The first element 2 can be set up to emit radiation from the red wavelength range. Then the second element 4 is preferably designed to emit radiation from the green wavelength range. Alternatively, the first element 2 may be arranged to emit radiation from the green wavelength range and the second element 4 may be arranged to emit radiation from the red wavelength range.

Preferably, the semiconductor chip 10 or at least one semiconductor chip 10 emits radiation from the blue wavelength range. This arrangement can be arranged on a circuit board 11. Contact structures for electrical contacting 13 can be arranged between circuit board 11 and semiconductor chip 10. For example, the conversion element can be applied to the main radiation exit surface of semiconductor chip 10 by an adhesive layer. The component of FIG. 3G can be used for backlighting. The component of FIG. 3H can be used for solid-state lighting.

FIGS. 4A and 4B show method steps according to an example.

The method is applied to a first carrier 1, which is a wafer. A plurality of semiconductor chips 10 are arranged on wafer 1. The semiconductor chips 10, for example, are arranged in a matrix.

Then method step B) is performed and the first element 2 is applied. Then method step C) follows and the second element 4 is applied (FIG. 4A).

As shown in FIG. 4B, separation can then take place and an optoelectronic component 1000 can be produced, which has a carrier 1, 8, for example, a first or second carrier, a semiconductor chip 10, which is completely embedded in the first element 2 and surrounded by the first element 2 in a frame-like manner. The second element 4 can then be arranged to the first element 2.

The examples described in connection with the figures and their characteristics can also be combined with each other according to further examples, even if such combinations are not explicitly shown in the figures. Furthermore, the examples described in connection with the figures may have additional or alternative features according to the description in the general part.

Our elements, components and methods are not limited to these by the description based on the description and examples. Rather, this disclosure includes each new feature and each combination of features, which includes in particular each combination of features in the appended claims, even if the feature or combination itself is not explicitly indicated in the claims, description or the examples.

This application claims priority of DE 102017116279.8, the subject matter of which is incorporated herein by reference.

What is claimed is:

1. A method of producing a plurality of conversion elements comprising:
    A) providing a first carrier,
    B) applying a first element directly to the first carrier using a first application technique, the first element comprising a conversion material, the first application technique being different from compression molding,
    C) applying a second element directly to the first element by a second application technique, the second element comprising quantum dots, the quantum dots being introduced into a matrix material and being different from the conversion material, the second application technique being compression molding,
    D) hardening of the matrix material,
    E) optionally, rearranging the arrangement produced according to step D) to a second carrier, and
    F) separating so that a plurality of conversion elements are generated.

2. The method according to claim 1, wherein the first application technique is a spray coating or electrophoretic deposition.

3. The method according to claim 1, wherein the quantum dots are toxic.

4. The method according to claim 1, wherein the quantum dots are selected from the group consisting of InP, CdS, CdSe, InGaAs, GaInP and CuInSe$_2$.

5. The method according to claim 1, wherein the conversion material is introduced into a further matrix material and the first element is formed as a layer.

6. The method according to claim 1, wherein the second element is formed as a layer.

7. The method according to claim 1, wherein the first element and the second element form a layer sequence.

8. The method according to claim 5, wherein the matrix material and/or the further matrix material are silicone, polysiloxane, epoxy or a hybrid material.

9. The method according to claim 1, wherein the first carrier is a film, a foil, a sheet, a laminate or a wafer.

10. The method according to claim 1, wherein at least one conversion element of the plurality of conversion elements is part of a solid state illumination.

11. The method according to claim 1, wherein at least one conversion element of the plurality of conversion elements is part of a backlight.

12. The method according to claim 1, wherein at least one conversion element of the plurality of conversion elements is introduced into a beam path of a semiconductor chip.

13. The method according to claim 1, wherein a plurality of semiconductor chips is introduced before step F), step E) does not take place, and the first carrier is a wafer.

14. The method according to claim 12, wherein the first element emits radiation from the green wavelength region, the second element emits radiation from the red wavelength region or vice versa, and the semiconductor chip emits radiation from the blue wavelength region.

15. The method according to claim 1, wherein the second carrier is a sawing foil.

16. A method of producing a plurality of conversion elements comprising:
    A) providing a first carrier,
    B) applying a first element to the first carrier using a first application technique, the first element comprising a conversion material, the first application technique being different from compression molding,
    C) applying a second element to the first carrier by a second application technique, the second element comprising quantum dots, the quantum dots being introduced into a matrix material and being different from the conversion material, the second application technique being compression molding,
    D) hardening of the matrix material,
    E) rearranging the arrangement produced according to step D) to a second carrier, and
    F) separating so that a plurality of conversion elements are generated.

17. A method of producing an optoelectronic component comprising:
- providing a first carrier,
- applying a first element to the first carrier using a first application technique, the first element comprising a conversion material, the first application technique being different from compression molding,
- applying a second element to the first carrier by a second application technique, the second element comprising quantum dots, the quantum dots being introduced into a matrix material and being different from the conversion material, the second application technique being compression molding,
- hardening of the matrix material, and
- separating so that a plurality of conversion elements are generated, wherein after separation, at least one conversion element of the plurality of conversion elements is introduced into a beam path of a semiconductor chip.

* * * * *